(12) United States Patent  
Kato

(10) Patent No.: US 10,800,419 B2  
(45) Date of Patent: Oct. 13, 2020

(54) DRIVE CYCLE CONTROLLER

(71) Applicant: KABUSHIKI KAISHA TOKAI RIKA DENKI SEISAKUSHO, Aichi (JP)

(72) Inventor: Yuichiro Kato, Aichi (JP)

(73) Assignee: KABUSHIKI KAISHA TOKAI RIKA DENKI SEISAKUSHO, Aichi (JP)

(*) Notice: Subject to any disclaimer, the term of this patent is extended or adjusted under 35 U.S.C. 154(b) by 113 days.

(21) Appl. No.: 16/009,225

(22) Filed: Jun. 15, 2018

(65) Prior Publication Data

US 2019/0001979 A1    Jan. 3, 2019

(30) Foreign Application Priority Data

Jun. 29, 2017   (JP) ................ 2017-127589

(51) Int. Cl.
```
B60R 22/00      (2006.01)
E05F 15/00      (2015.01)
G05D 1/00       (2006.01)
G05D 3/00       (2006.01)
G06F 7/00       (2006.01)
G06F 17/00      (2019.01)
B60W 30/188     (2012.01)
B60W 50/04      (2006.01)
G06F 1/3228     (2019.01)
H03K 17/96      (2006.01)
G06F 1/3203     (2019.01)
```
(Continued)

(52) U.S. Cl.
CPC ........ *B60W 30/188* (2013.01); *B60W 50/045* (2013.01); *G06F 1/3203* (2013.01); *G06F 1/3228* (2013.01); *H03K 17/96* (2013.01); *B60W 2050/0013* (2013.01); *B60W 2050/0014* (2013.01); *B60W 2050/0044* (2013.01); *B60W 2050/0095* (2013.01); *H03K 2017/515* (2013.01); *H03K 2217/94042* (2013.01); *H03K 2217/960705* (2013.01)

(58) Field of Classification Search
CPC . B60W 30/188; B60W 50/045; G06F 1/3203; G06F 1/3228; G06F 3/044; H03K 17/96
USPC .......................................... 701/48; 345/174
See application file for complete search history.

(56) References Cited

U.S. PATENT DOCUMENTS

| 2014/0239975 | A1* | 8/2014 | Baudru | G01R 27/2605 324/601 |
| 2014/0267157 | A1* | 9/2014 | Dorfner | G06F 3/044 345/174 |
| 2015/0360646 | A1 | 12/2015 | Meyers | |

FOREIGN PATENT DOCUMENTS

| GB | 2451352 A | 1/2009 |
| JP | 2013-091365 A | 5/2013 |

(Continued)

*Primary Examiner* — Mahmoud S Ismail

(57) ABSTRACT

A drive cycle controller includes a drive cycle switching unit and an output state determination unit. The drive cycle switching unit switches a drive cycle of a microcomputer, which monitors an output of a device, from a first drive cycle to a second drive cycle that is shorter than the first drive cycle if the microcomputer detects a change in an output of the device at an activation timing in the first drive cycle. The output state determination unit determines an output state of the device if the microcomputer confirms that the output has remained changed at an activation timing in the second drive cycle.

6 Claims, 2 Drawing Sheets

(51) Int. Cl.
 *B60W 50/00* (2006.01)
 *H03K 17/51* (2006.01)

(56) References Cited

FOREIGN PATENT DOCUMENTS

JP 2013-104822 A 5/2013
JP 2014-135091 A 7/2014

* cited by examiner

DRIVE CYCLE CONTROLLER

CROSS-REFERENCE TO RELATED APPLICATIONS

This application is based upon and claims the benefit of priority from prior Japanese Patent Application No. 2017-127589, filed on Jun. 29, 2017, the entire contents of which are incorporated herein by reference.

FIELD

This disclosure relates to a drive cycle controller that controls a drive cycle of a microcomputer.

BACKGROUND

A known microcomputer (for example, CPU) is activated at a cyclic activation timing in accordance with a clock cycle or the like to confirm the output of a device subject to monitoring such as a switch device or a sensor device at the activation timing and control various operations (refer to Japanese Laid-Open Patent Publication No. 2013-104822).

SUMMARY

In such a type of microcomputer, it is desired that the current consumption be further reduced.

One embodiment is a drive cycle controller including a drive cycle switching unit and an output state determination unit. The drive cycle switching unit switches a drive cycle of a microcomputer that monitors an output of a device. The drive cycle switching unit switches the drive cycle from a first drive cycle to a second drive cycle that is shorter than the first drive cycle if the microcomputer detects a change in the output of the device at an activation timing in the first drive cycle. The output state determination unit determines an output state of the device if the microcomputer confirms that the output of the device has remained changed at an activation timing in the second drive cycle.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1:
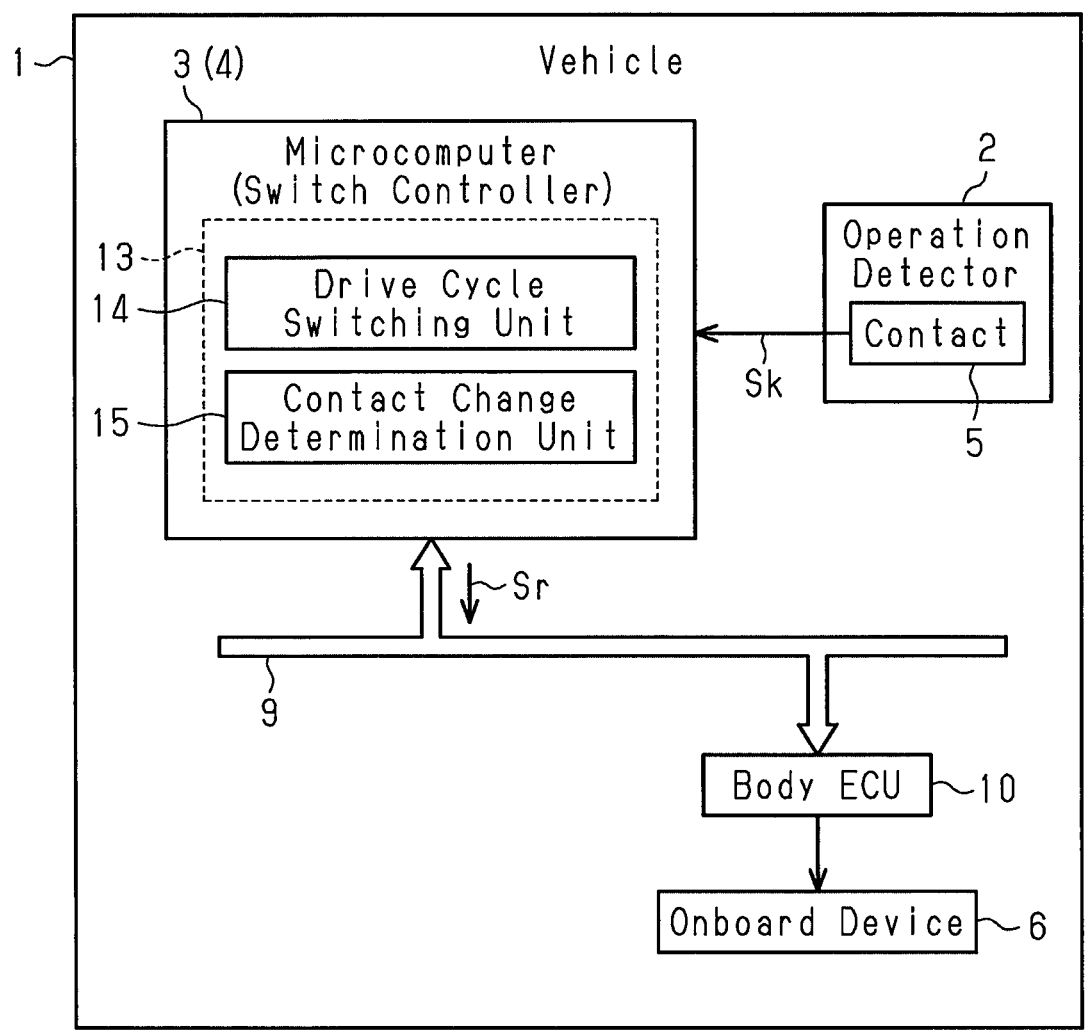
FIG. 1 is a schematic diagram of one embodiment of a drive cycle controller.

Embodiments will now be described with reference to the accompanying drawings. Elements in the drawings may be partially enlarged for simplicity and clarity and thus have not necessarily been drawn to scale.

One embodiment of a drive cycle controller will now be described with reference to FIGS. 1 to 3.

As illustrated in FIG. 1, a vehicle 1 includes a microcomputer 3 that monitors the output of a device. In one non-restrictive example, the device may be an operation detector 2 arranged in the vehicle 1. In the example of FIG. 1, the operation detector 2 includes a switch device, and the microcomputer 3 may function as a switch controller 4 that monitors the output of the operation detector 2 (i.e., output of device). For example, the operation detector 2 includes a contact 5 that goes on and off in accordance with a switching operation of a switch unit (not illustrated) that is operable by a user. The operation detector 2 outputs a detection signal Sk indicating whether the contact 5 is on or off. The microcomputer 3 confirms whether the contact 5 is on or off based on a monitoring result of the detection signal Sk, which is output from the operation detector 2. The microcomputer 3 functioning as the switch controller 4 is activated at a cyclic activation timing in a drive cycle Tx based on a clock cycle or the like to confirm the detection signal Sk of the operation detector 2 at the activation timing. The operation detector 2 may be a combination switch used to switch an actuation state of (for example, on and off) an onboard device 6 such as a vehicle light or a blinker. However, the operation detector 2 is not limited to the switch device.

The switch controller 4 is connected to a communication line 9 arranged in the vehicle 1. The communication line 9 may be, for example, a local interconnect network (LIN) or a controller area network (CAN). The switch controller 4 monitors the detection signal Sk output from the operation detector 2 and detects a change in the detection signal Sk (in the present example, change in contact 5 from off state to on state or from on state to off state). Then, the switch controller 4 determines an output state of the operation detector 2 (in the present example, on state or off state of contact 5) when a predetermined condition is satisfied and generates the control signal Sr in accordance with the output state. The control signal Sr is provided to a body ECU 10 (onboard device controller) connected to the communication line 9. The body ECU 10 controls the onboard device 6 based on the control signal Sr.

The switch controller 4 includes a drive cycle control function (drive cycle controller 13) that switches the drive cycle Tx of the microcomputer 3 (switch controller 4) based on a monitoring result of the detection signal Sk. As described above, the microcomputer 3 confirms whether the contact 5 is on or off at the activation timing in the drive cycle Tx. In the present example, if the microcomputer 3 detects a change in the contact 5 from an off state to an on state (or from on state to off state) at the activation timing in the drive cycle Tx, the drive cycle controller 13 switches the drive cycle Tx to a shorter cycle.

The drive cycle controller 13 includes a drive cycle switching unit 14 that switches the drive cycle Tx. In the present example, the drive cycle switching unit 14 is realized as a function of the microcomputer 3 but is not limited to the function of the microcomputer 3. If the microcomputer 3 detects a change in the output of the detection signal Sk (in the present example, change in contact 5 between on and off states) at an activation timing of a first drive cycle Ta, the drive cycle switching unit 14 switches the drive cycle Tx from the first drive cycle Ta to a second drive cycle Tb. The second drive cycle Tb is shorter than the first drive cycle Ta.

The drive cycle controller 13 includes a contact change determination unit 15 that determines a changed value of the detection signal Sk (in the present example, on/off state of contact 5). The contact change determination unit 15 is one example of an output state determination unit. In the present example, the contact change determination unit 15 is realized as a function of the microcomputer 3 but is not limited to the function of the microcomputer 3. After the drive cycle switching unit 14 switches the first drive cycle Ta to the second drive cycle Tb (i.e., after change in detection signal Sk is detected), if the microcomputer 3 confirms at the activation timing in the second drive cycle Tb that the detection signal Sk has remained changed, the contact change determination unit 15 determines the changed value of the detection signal Sk. In one non-restrictive example, if the microcomputer 3 successively confirms for a number of times that the detection signal Sk has remained changed at the activation timing in the second drive cycle Tb (for example, contact 5 has remained changed to on state), the contact change determination unit 15 determines the changed value of the detection signal Sk (in this case, on state of contact 5).

The operation and advantages of the drive cycle controller 13 will now be described with reference to FIGS. 2 and 3.

Figure 2:
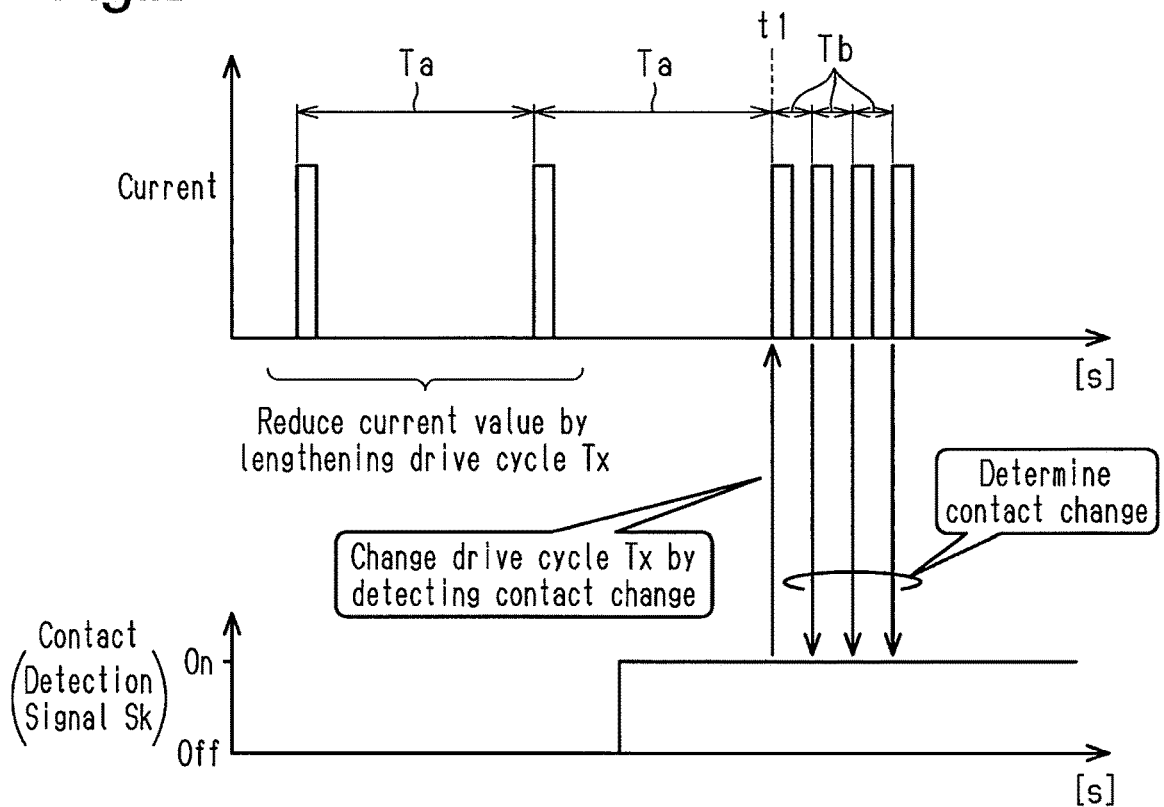
FIG. 2 is a timing chart illustrating one example of the relationship of a drive cycle of a microcomputer and a change in a device output (for example, change in contact) during a drive cycle switching mode.

FIG. 2 illustrates one example of an actuation sequence of the microcomputer 3 (switch controller 4) according to a drive cycle switching mode. As illustrated in FIG. 2, the microcomputer 3, which is intermittently activated at the cyclic activation timing in accordance with the drive cycle Tx, monitors the detection signal Sk at the activation timing to confirm whether the contact 5 is on or off. In the example of FIG. 2, if the detection signal Sk indicates that the contact 5 is off, the microcomputer 3, which is intermittently activated at the activation timing in the first drive cycle Ta, confirms whether the contact 5 is on or off at each activation timing. As described above, the first drive cycle Ta is a relatively long drive cycle and is longer than the second drive cycle Tb. Thus, during a period in which the drive cycle Tx is set to the first drive cycle Ta, that is, during a period until the microcomputer 3 detects a change in the detection signal Sk, the current consumption is reduced in the microcomputer 3. In this manner, the microcomputer 3 is intermittently activated at the activation timing in the drive cycle Tx not only in a state in which the vehicle power supply is on but also in a state in which the vehicle power supply is off. The reduction in current consumption in a state in which the vehicle power supply is off prolongs the life of the vehicle battery. For example, an on state of the vehicle power supply may include an IG-on state and an ACC-on state, and an off state of the vehicle power supply may be an IG-off state.

If the contact 5 changes from an off state to an on state, the microcomputer 3 detects a change in the detection signal Sk at an activation time t1 (refer to FIG. 2) in the first drive cycle Ta that comes first after the contact 5 changes to the on state. If the microcomputer 3 detects the change in the contact 5 to the on state at time t1, the drive cycle switching unit 14 switches the drive cycle Tx from the first drive cycle Ta to the second drive cycle Tb. This intermittently activates the microcomputer 3 in a shorter cycle (Tb). Thus, from time t1, priority is given to the process for determining a contact change (i.e., verifying output change) rather than reducing current consumption.

After the drive cycle Tx is switched to the second drive cycle Tb, the microcomputer 3 confirms whether or not the detection signal Sk has remained changed (in example of FIG. 2, whether or not contact 5 has remained on) at the activation timing in the second drive cycle Tb. In one non-restrictive example, if the microcomputer 3 successively confirms for a number of times that the contact 5 has remained on, the contact change determination unit 15 determines the change in the contact 5 to the on state. In this manner, if the microcomputer 3 successively confirms for a number of times that the detection signal Sk has remained changed at the activation timing in the second drive cycle Tb, the contact change determination unit 15 determines the changed value of the detection signal Sk.

If a change in the contact 5 to the on state is determined, the contact change determination unit 15 generates the control signal Sr in correspondence with the on state of the contact 5 and outputs the control signal Sr to the communication line 9. The control signal Sr is provided to the body ECU 10, which is one example of the onboard device controller, via the communication line 9. The body ECU 10 actuates the onboard device 6 in accordance with the control signal Sr. For example, when the onboard device 6 is a vehicle light, the body ECU 10 turns on the vehicle light in accordance with the control signal Sr corresponding to the on state of the contact 5. Thus, the switch controller 4 monitors the state of the contact 5 to enable switching of the vehicle light from off to on regardless of whether the vehicle power supply is IG-on (ACC-on) or IG-off.

Although not illustrated in the drawings, after determining the on state of the contact 5, the drive cycle switching unit 14 returns the drive cycle Tx from the second drive cycle Tb to the first drive cycle Ta. In the same manner as above, if the microcomputer 3 detects a change in the contact 5 from the on state to the off state at the activation timing in the first drive cycle Ta, the drive cycle switching unit 14 switches the first drive cycle Ta to the second drive cycle Tb. Subsequently, for example, if the microcomputer 3 successively confirms for a number of times that the contact 5 has remained changed to the off state at the activation timing in the second drive cycle Tb, the contact change determination unit 15 determines the off state of the contact 5. Then, the drive cycle switching unit 14 returns the second drive cycle Tb to the first drive cycle Ta.

Figure 3:
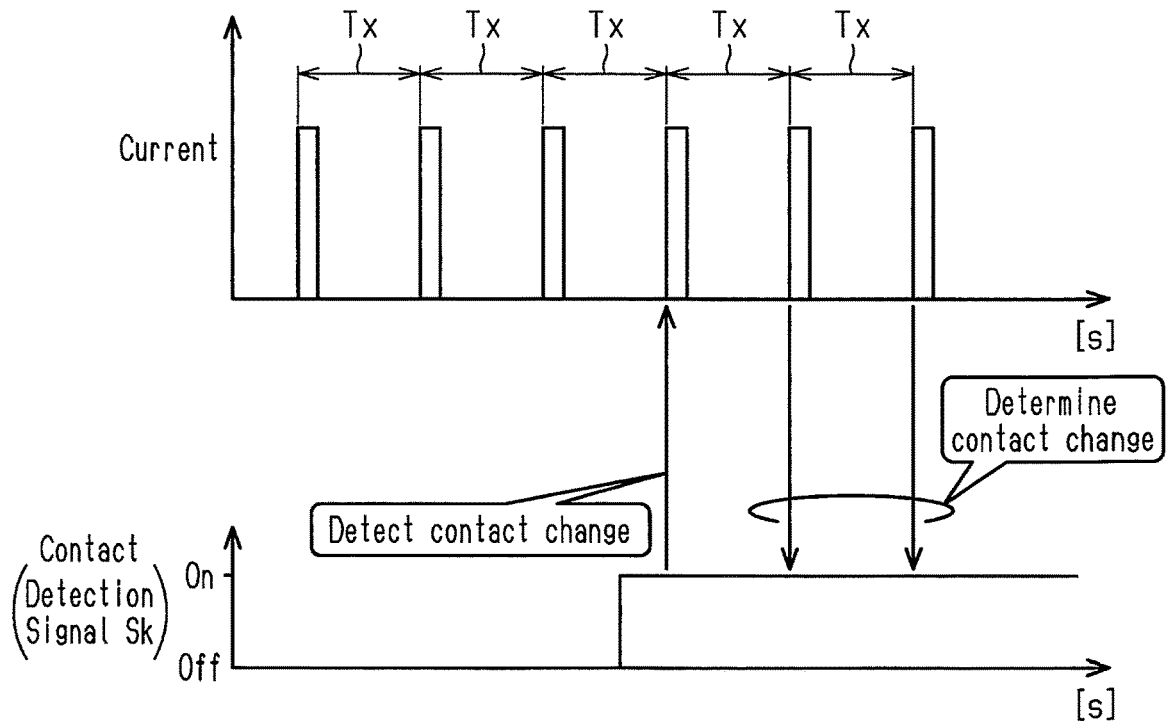
FIG. 3 is a timing chart illustrating one example of the relationship of a drive cycle of the microcomputer and a change in a device output (for example, change in contact) during a fixed drive cycle mode.

FIG. 3 illustrates one example of an actuation sequence of the microcomputer 3 (switch controller 4) according to a fixed drive cycle mode. In the vehicle 1, the switch controller 4 actuates the onboard device 6 such as a vehicle light when a change in the contact 5 is detected regardless of whether the vehicle power supply is on (IG-on/ACC-on) or off (IG-off). Thus, regardless of whether the vehicle power supply is on or off, the microcomputer always needs to be intermittently activated. As illustrated in FIG. 3, if the drive cycle Tx is always an equal interval (i.e., fixed cycle), the microcomputer 3 needs to be activated in a state in which the vehicle power supply is off at the same cycle as in a state in which the vehicle power supply is on. This increases dark current.

In the present example, in a state in which the vehicle power supply is off, the drive cycle switching unit 14 sets the drive cycle Tx to the first drive cycle Ta, which is a relatively long cycle. If the microcomputer 3 detects a change in the detection signal Sk (in the present example, change in contact 5 from off state to on state or from on state to off state), the drive cycle switching unit 14 switches the drive cycle Tx to the second drive cycle Tb, which is a relatively short cycle. Thus, when a switching operation is not performed and the output of the operation detector 2 does not change (i.e., no change occurs in contact 5) during a period in which the vehicle power supply is off, dark current is reduced. Additionally, after a contact change is detected, the drive cycle Tx is set to the second drive cycle Tb, which is shorter than the first drive cycle Ta. This shortens the time required from when the contact change is detected to when the contact change is determined. Such a switching process of the drive cycle Tx is performed not only when the contact 5 shifts from an off state to an on state but also when the contact 5 shifts from an on state to an off state.

As described above, in the present example, before the microcomputer 3 detects a change in the contact, the drive cycle Tx is set to the first drive cycle Ta. This reduces the current consumption of the microcomputer 3 during the period of the first drive cycle Ta. In addition, after the microcomputer 3 detects a contact change, the drive cycle Tx is switched to the second drive cycle Tb, which is shorter than the first drive cycle Ta. This shortens the time required from when the contact change is detected to when the contact change is determined. Accordingly, the current consumption of the microcomputer 3 is reduced without lengthening the time required from when the contact change actually occurs to when the contact change is determined.

Further, if the microcomputer 3 successively confirms for a number of times that the state of the contact 5 has remained changed at the activation timing in the second drive cycle Tb, the contact change determination unit 15 determines the changed state of the contact 5. This improves the determination accuracy and allows for accurate determination that a switching operation of the operation detector 2 has changed the state of the contact 5.

In addition, in the present example, after the changed state of the contact 5 is determined, the drive cycle switching unit 14 returns the drive cycle Tx to the first drive cycle Ta. For example, the drive cycle switching unit 14 switches the drive cycle Tx between the first drive cycle Ta and the second drive cycle Tb by repeating the detection process and the determination process of the contact change. Thus, after the changed state of the contact 5 is determined, the drive cycle Tx is returned to the first drive cycle Ta. This reduces the current consumption.

Additionally, in the present example, the operation detector 2 detects a switching operation for switching the actuation state of the onboard device 6 and outputs the detection signal Sk, which indicates that the contact 5 is on or off. In a state in which the vehicle power supply is off, the drive cycle switching unit 14 switches the drive cycle Tx between the first drive cycle Ta and the second drive cycle Tb based on a monitoring result of the detection signal Sk. This decreases the number of times the microcomputer 3 is intermittently activated in a state in which the vehicle power supply is off. Thus, the current consumption is reduced in a state in which the vehicle power supply is off.

It should be apparent to those skilled in the art that the foregoing embodiments may be implemented in many other specific forms without departing from the scope of this disclosure. Particularly, it should be understood that the foregoing embodiments may be implemented in the following forms.

In the above embodiment, the drive cycle switching mode of FIG. 2 may be executed in a state in which the vehicle power supply is off, and the fixed drive cycle mode of FIG. 3 may be executed in a state in which the vehicle power supply is on. For example, the drive cycle switching unit 14 may enter the drive cycle switching mode in a state in which the vehicle power supply is off and enter the fixed drive cycle mode in a state in which the vehicle power supply is on. In the drive cycle switching mode, the drive cycle switching unit 14 switches the drive cycle Tx between the first drive cycle Ta and the second drive cycle Tb (refer to FIG. 2). In the fixed drive cycle mode, the drive cycle switching unit 14 sets the drive cycle Tx to a third drive cycle (for example, period illustrated in FIG. 3) having a fixed cycle. In this case, the first drive cycle Ta is longer than the third drive cycle, and the second drive cycle Tb is shorter than the third drive cycle. Such a drive cycle control reduces current consumption in a state in which the vehicle power supply is off while more quickly detecting the contact change in a state in which the vehicle power supply is on.

The microcomputer 3 is not limited to the switch controller 4. The microcomputer 3 only needs to be a device that monitors the output of the operation detector 2 (device subject to monitoring) and detects a change in the output.

The operation detector 2 (device subject to monitoring) may be a switch device other than a lever combination switch. In addition, the operation detector 2 is not limited to a switch device and may be a sensor device. The operation detector 2 may not have the contact 5 as long as the output of the operation detector 2 (i.e., output of device) changes.

In the above embodiment, the contact change determination unit 15 determines a changed state of the contact 5 if the microcomputer 3 successively confirms for a number of times that the state of the detection signal Sk has remained changed. Instead, for example, if the microcomputer 3 detects the changed state (for example, on state) of the contact 5 a given number of times during a certain period, the contact change determination unit 15 may determine the changed state of the contact 5. Alternatively, the contact change determination unit 15 may perform the determination process in any other mode.

After a contact change is determined, the drive cycle switching unit 14 does not have to immediately return from the second drive cycle Tb to the first drive cycle Ta. For example, after a contact change is determined, the drive cycle switching unit 14 may switch the second drive cycle Tb to a cycle between the first drive cycle Ta and the second drive cycle Tb. Alternatively, for example, the drive cycle switching unit 14 may gradually return the second drive cycle Tb to the first drive cycle Ta.

The onboard device 6 is not limited to a vehicle light and may be changed to another device or apparatus.

The drive cycle controller 13 does not have to be used for the vehicle 1 and may be applied to another system or device.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A drive cycle controller comprising:
 a drive cycle switch that switches a drive cycle of a microcomputer that monitors an output of a device, wherein the drive cycle switch switches the drive cycle from a first drive cycle to a second drive cycle that is shorter than the first drive cycle if the microcomputer detects a change in the output of the device at an activation timing in the first drive cycle; and
 an output state determiner that determines an output state of the device if the microcomputer confirms that the output of the device has remained changed at an activation timing in the second drive cycle, wherein the drive cycle switch enters a drive cycle switching mode in a state in which a vehicle power supply is off and enters a fixed drive cycle mode in a state in which the vehicle power supply is on, the drive cycle switch in the drive cycle switching mode switches the drive cycle between the first drive cycle and the second drive cycle, the drive cycle switch in the fixed drive cycle mode sets the drive cycle to a third drive cycle having a fixed cycle, and the first drive cycle is longer than the third drive cycle, and the second drive cycle is shorter than the third drive cycle.

2. The drive cycle controller according to claim 1, wherein the output state determiner determines an output state of the device if the microcomputer successively confirms for a number of times that the output of the device has remained changed at the activation timing in the second drive cycle.

3. The drive cycle controller according to claim 1, wherein the drive cycle switch returns the drive cycle from the second drive cycle to the first drive cycle after the output state determiner determines an output state of the device.

4. The drive cycle controller according to claim 1, wherein the device is an operation detector that detects a switching operation for switching an actuation state of an onboard device, the operation detector includes a contact that goes on and off in accordance with the switching operation, the operation detector outputs a detection signal indicating whether the contact is on or off, and the drive cycle switch switches the drive cycle between the first drive cycle and the second drive cycle based on a monitoring result of the detection signal in a state in which a vehicle power supply is off.

5. The drive cycle controller according to claim 1, wherein when an output state of the device is determined, the output state determiner generates a control signal in correspondence with the output state of the device and provides the control signal to an onboard device controller via a communication line of a vehicle.

6. A drive cycle controller comprising:

a drive cycle switching unit that switches a drive cycle of a microcomputer that monitors an output of a device, wherein the drive cycle switching unit switches the drive cycle from a first drive cycle to a second drive cycle that is shorter than the first drive cycle if the microcomputer detects a change in the output of the device at an activation timing in the first drive cycle; and an output state determination unit that determines an output state of the device if the microcomputer confirms that the output of the device has remained changed at an activation timing in the second drive cycle, wherein the drive cycle switching unit enters a drive cycle switching mode in a state in which a vehicle power supply is off and enters a fixed drive cycle mode in a state in which the vehicle power supply is on, the drive cycle switching unit in the drive cycle switching mode switches the drive cycle between the first drive cycle and the second drive cycle, the drive cycle switching unit in the fixed drive cycle mode sets the drive cycle to a third drive cycle having a fixed cycle, and the first drive cycle is longer than the third drive cycle, and the second drive cycle is shorter than the third drive cycle.

* * * * *